United States Patent
Kim

(10) Patent No.: US 11,870,414 B2
(45) Date of Patent: Jan. 9, 2024

(54) FILM BULK ACOUSTIC RESONATOR CHIP AND PACKAGE STRUCTURE WITH IMPROVED TEMPERATURE COEFFICIENT

(71) Applicant: WISOL CO., LTD., Osan-si (KR)

(72) Inventor: Young Hun Kim, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 416 days.

(21) Appl. No.: 17/158,372

(22) Filed: Jan. 26, 2021

(65) Prior Publication Data
US 2022/0060169 A1 Feb. 24, 2022

(30) Foreign Application Priority Data

Aug. 20, 2020 (KR) .......................... 10-2020-0104684

(51) Int. Cl.
*H03H 9/02* (2006.01)
*H03H 9/205* (2006.01)
*H03H 9/17* (2006.01)

(52) U.S. Cl.
CPC ........ *H03H 9/02102* (2013.01); *H03H 9/173* (2013.01); *H03H 9/205* (2013.01)

(58) Field of Classification Search
CPC ........................... H03H 9/02102; H03H 9/205
See application file for complete search history.

(56) References Cited

U.S. PATENT DOCUMENTS

| | | | | |
|---|---|---|---|---|
| 2013/0127565 A1* | 5/2013 | Nishihara | .......... | H03H 9/02102 333/133 |
| 2015/0318837 A1* | 11/2015 | Zou | .................... | H03H 9/02086 333/187 |
| 2016/0182011 A1* | 6/2016 | Burak | .................... | H03H 9/175 310/346 |
| 2017/0288636 A1* | 10/2017 | Zou | .................... | H03H 9/02448 |
| 2017/0310303 A1* | 10/2017 | Thalhammer | ............ | H03H 9/58 |
| 2018/0048290 A1* | 2/2018 | Sekine | ................... | H03H 9/171 |
| 2018/0069528 A1* | 3/2018 | Qiu | ........................ | H03H 9/173 |

FOREIGN PATENT DOCUMENTS

| | | |
|---|---|---|
| JP | 2018-026735 A | 2/2018 |
| JP | 2020-065160 A | 4/2020 |
| KR | 10-2018-0017941 A | 2/2018 |

OTHER PUBLICATIONS

KIPO Office Action, dated Mar. 29, 2022, for Korean Patent Application No. 10-2020-0104684 which corresponds to the above-identified U.S. application.

* cited by examiner

*Primary Examiner* — Bryan P Gordon
(74) *Attorney, Agent, or Firm* — LRK PATENT LAW FIRM

(57) ABSTRACT

A film bulk acoustic resonator (FBAR) chip and package structure with an improved temperature coefficient that is capable of being more stable with respect to surrounding temperature changes, without any decrease in performance of Q factor or k2e. The FBAR chip and package structure includes a plurality of FBARs located on a central area of one surface of a substrate and each having a bottom electrode, a piezoelectric material, and a top electrode; and a temperature compensation layer formed around the central area of one surface of the substrate.

9 Claims, 5 Drawing Sheets

| material | linear expansion coefficient ($\times 10^{-6}$/K) |
|---|---|
| diamond | 1.1 |
| Ir | 7.1 |
| MgO | 13.8 |
| $Al_2O_3$ | 6.7 |
| SiC | 6.6 |
| AlN | 4.5 |
| Si | 4.2 |
| $Si_3N_4$ | 1.5 |
| $SiO_2$ | 0.5 |

FILM BULK ACOUSTIC RESONATOR CHIP AND PACKAGE STRUCTURE WITH IMPROVED TEMPERATURE COEFFICIENT

CROSS-REFERENCE TO RELATED APPLICATION

The present application claims the benefit of Korean Patent Application No. 10-2020-0104684 filed in the Korean Intellectual Property Office on Aug. 20, 2020, the entire contents of which are incorporated herein by reference.

BACKGROUND OF THE INVENTION

1. Field of the Invention

The present invention relates to a film bulk acoustic resonator (hereinafter referred to as "FBAR") chip and package structure with an improved temperature coefficient, and more particularly, to an FBAR chip and package structure that is capable of achieving better stability with respect to a change in temperature than a conventional FBAR chip and package structure.

2. Description of Related Art

As a need for miniaturization and high-density stacking of a small electronic device like a smartphone is greatly increasing, recently, surface-mount technology for an electronic element like a semiconductor integrated circuit (IC) is drastically evolved.

Instead of chip unit packaging, wafer level packaging is introduced to remarkably decrease a packaging thickness, and a lamination substrate is adopted even in a printed circuit board to thus develop various materials, equipment and process technologies.

With the development of information and communication technology and the evolution of networks, further, an amount of information used or needed by people becomes rapidly huge, and accordingly, all kinds of electronic devices have to stack a substantially larger number of parts in limited space than before so as to provide various, new and high-end functions, so that they become more and more complicated and the electronic elements are located closer to one another to satisfy the needs for miniaturization and multiple functions.

As all kinds of parts in the electronic device are miniaturized and highly functionalized, they come into closer contact with one another, and accordingly, heat dissipation from the interior of the electronic device is one of important technological issues, so that there is a need to enable the parts to be more stable with respect to a change in temperature.

A temperature coefficient is the sensitivity of a given physical quantity with respect to a change in temperature, and the temperature coefficient is a constant indicating a degree of change per unit temperature (1° C. or 1° F.) when the given physical quantity is varied according to temperature, while using unit of ppm (parts per million). In the case of the filter using surface acoustic wave (SAW) or BAW (bulk acoustic wave), especially, the resonant frequency of the filter moves according to the increment or decrement of the temperature generated from the outside or inside, and a degree of change in frequency normalized according to the change in temperature is called a temperature coefficient of the filter.

On the other hand, present BAW filters that have good band pass characteristics and cutoff performance have kept appropriate temperature coefficients, so that they can be applied to the existing smartphones, without any problem, but as communication sizes become strict and the temperature coefficients of the SAW filters as rivals of the BAW filter become improved, an improvement in temperature coefficient even in the BAW filters is needed. Up to now, however, there is no proper improvement in the temperature coefficient in the BAW filter.

In the case of the existing SAW filter, the temperature coefficient is in the middle of 40 ppm/° C., and in the case of an advanced SAW filter, the temperature coefficient is almost 0 ppm/° C. In the case of the BAW filter, however, the temperature coefficient is still 30 ppm/° C., which requires an improvement, and in the case of particularly FBAR filters, no method for improving the temperature coefficient without any decrease in performance has been found.

In the case of some of the FBAR filters, as shown in FIG. 7, a temperature compensation layer 30 with a positive temperature coefficient is formed on top of a piezoelectric layer 20 around an FBAR or on underside of a top electrode TE or bottom electrode BE, thereby improving the temperature coefficient, but unfortunately, the decrease in performance like Q (quality) factor or k2e (electro-mechanical coupling factor) occurs.

In the structures as shown in FIG. 7, the temperature compensation layer 30 is formed on each of the FBARs, not on the entire package, and accordingly, the decrease in temperature coefficient still occurs on the entire package.

Accordingly, there is a need for development of a new FBAR chip and package structure that can satisfy the temperature coefficient needed and prevent the decrease in performance in the Q factor or k2e.

SUMMARY OF THE INVENTION

Accordingly, the present invention has been made in view of the above-mentioned problems occurring in the related art, and it is an object of the present invention to provide an FBAR chip and package structure that is capable of being more stable with respect to the change in surrounding temperature and the heat generated when high power is applied.

It is another object of the present invention to provide an FBAR chip and package structure that is capable of having an improved temperature coefficient.

It is yet another object of the present invention to provide an FBAR chip and package structure that is capable of having an improved temperature coefficient, without any decrease in performance of Q factor or k2e.

To accomplish the above-mentioned objects, according to the present invention, there is provided a film bulk acoustic resonator (FBAR) chip and package structure with an improved temperature coefficient, including: a plurality of FBARs located on a central area of one surface of a substrate and each having a bottom electrode, a piezoelectric material, and a top electrode; and a temperature compensation layer formed around the central area of one surface of the substrate.

According to the present invention, desirably, the temperature compensation layer is formed on the substrate to completely surround the central area of one surface of the substrate.

According to the present invention, desirably, the temperature compensation layer comes into contact with the piezoelectric materials of the FBARs in such a manner as to be formed on the outsides of the piezoelectric materials.

According to the present invention, desirably, when viewed on top of the substrate, the boundary line between the temperature compensation layer and the piezoelectric materials is irregularly formed with a concave/convex shape along the FBARs arranged on the substrate.

According to the present invention, desirably, the temperature compensation layer is formed on at least some areas of both sides of at least one of the outermost FBARs from the center.

According to the present invention, desirably, the temperature compensation layer is formed on at least some areas of both sides of at least one connected directly to a signal input or output pad or ground pad among the FBARs.

According to the present invention, desirably, when viewed on top of the substrate, the boundary line between the temperature compensation layer and the piezoelectric materials is formed linearly or archedly, with no concave/convex shape.

According to the present invention, desirably, when viewed on top of the substrate, the temperature compensation layer is formed to allow a width on an edge side where a larger number of the FBARs are arranged than other edge sides to be larger than widths of other edges.

According to the present invention, desirably, the temperature compensation layer is spaced apart from the piezoelectric materials in such a manner as to be formed on the outsides of the piezoelectric materials.

According to the present invention, desirably, when viewed on top of the substrate, the outside boundary lines of the piezoelectric materials are irregularly formed with concave/convex shapes according to the arrangements of the FBARs.

According to the present invention, desirably, the temperature compensation layer is formed in such a manner as to be cut in some sections thereof.

According to the present invention, desirably, the outermost edges of the piezoelectric materials are extended up to the outside over the temperature compensation layer.

According to the present invention, desirably, the temperature compensation layer is made of silicon dioxide ($SiO_2$) or silicon nitride ($Si_3N_4$).

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE EMBODIMENTS

Now, an explanation on embodiments of the present invention will be given with reference to the attached drawings. Objects, characteristics and advantages of the present invention will be more clearly understood from the detailed description as will be described below and the attached drawings. Before the present invention is disclosed and described, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure.

In the description, when it is said that one portion is described as "includes" any component, one element further may include other components unless no specific description is suggested.

In the description, further, when it is said that one element is described as being "connected" to the other element, one element may be "directly connected" to the other element, but it should be understood that one element may be "indirectly" or "electrically connected" to the other element, while another element or device being present between the two elements.

In the description, when it is said that a layer (film), area, pattern or structure is located "on" or "under" a substrate, layer (film), area, pad, or pattern, it means that one member may come into contact with another member as well as yet another member may exist between the two members. Top and underside of the layer will be explained with reference to drawings.

Terms, such as the first and the second may be used to describe various elements, but the elements should not be restricted by the terms. The terms are used to only distinguish one element from the other element.

The steps may be differently carried out from the described order unless a specific order is described. Of course, other steps may be added or some steps may be deleted.

Figure 1:
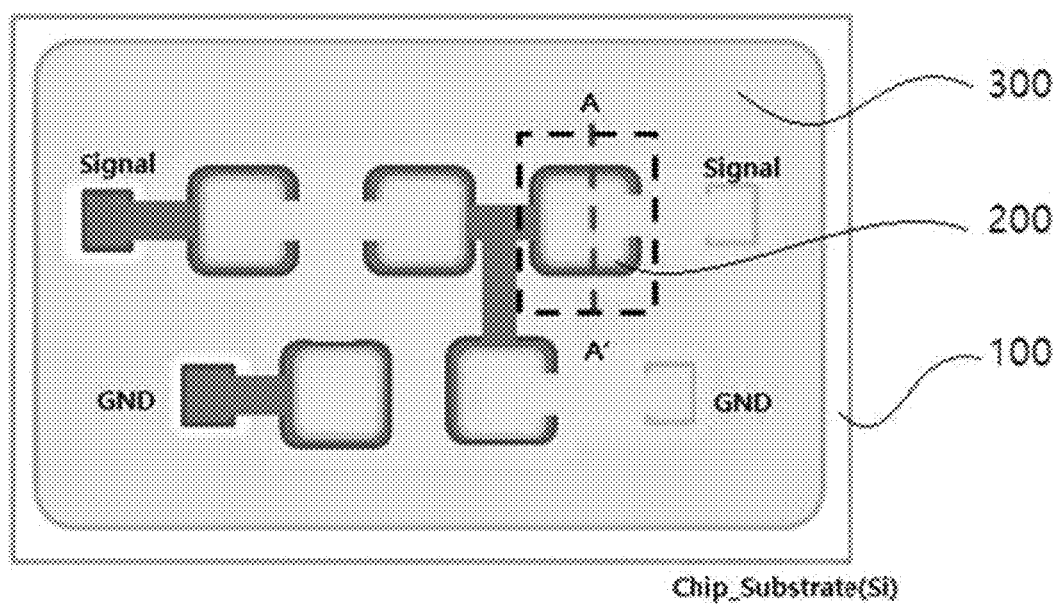
FIG. 1 is a top view showing a first example of a temperature compensation layer in an FBAR chip and package structure according to the present invention.
Figure 2:
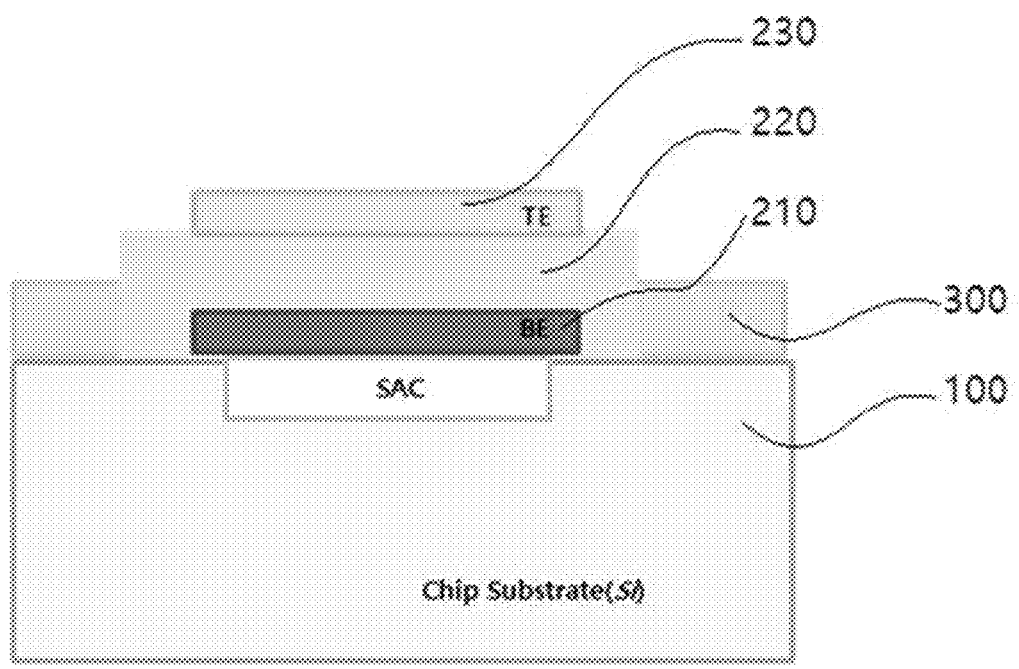
FIG. 2 is a sectional view taken along the line A-A' of one FBAR of FIG. 1.

FIG. 1 is a top view showing a first example of a temperature compensation layer in an FBAR chip and package structure according to the present invention, and FIG. 2 is a sectional view taken along the line A-A' of one FBAR of FIG. 1.

Referring to FIGS. 1 and 2, an FBAR chip and package structure according to the present invention includes a plurality of FBARs 200 located on a central area of a substrate 100 and a temperature compensation layer 300 formed on the substrate 100 to surround the plurality of FBARs 200 thereby.

According to the present invention, that is, the temperature compensation layer 300 is not formed only for one FBAR 200, but formed for the whole package.

The substrate 100 may be a silicon (Si) substrate.

Each FBAR 200 includes a bottom electrode 210, a piezoelectric material 220, and a top electrode 230 formed sequentially on the substrate 100 and an air cavity (SAC) formed under the bottom electrode 210 to easily generate a bulk acoustic wave therefrom.

The FBARs 200 are located on the central area of the substrate 100, and the temperature compensation layer 300 is formed on the substrate 100 to surround the central area of the substrate 100.

The temperature compensation layer 300 as shown in FIG. 1 comes into contact with the piezoelectric materials 220 of the FBARs 200 in such a manner as to be formed to the outsides of the piezoelectric materials 220, while completely surrounding the central area of the substrate 100.

As shown in FIG. 1, the boundary line between the temperature compensation layer 300 and the piezoelectric materials 220 is irregularly formed with a concave/convex shape along the plurality of FBARs 200 arranged on the substrate 100.

If the temperature compensation layer 300 is formed, like this, the temperature compensation layer 300 can be formed on at least some areas of both sides of at least one (that is, at least one FBAR connected directly to a signal input or output pad or ground pad of FIG. 1) of the plurality of FBARs 200 located at the outermost edges of the substrate 100.

In this case, the temperature compensation layer 300 can be formed closest to the central area on which the FBARs 200 are located in such a manner as to be as large as possible on the substrate 100. Accordingly, the temperature compensation layer 300 can be formed with a substantially large area on the substrate 100, thereby most greatly improving the temperature coefficient.

According to the present invention, in addition, the temperature compensation layer 300 may be formed with different shapes and positions from the shape as shown in FIG. 1, Though, in FIG. 2, top of the temperature compensation layer 300 is exposed to the outside of the piezoelectric material 200, but according to a material used as the temperature compensation layer 300, that is, in the case of a material (for example, silicon dioxide ($SiO_2$)) that may has a danger of being removed together with hydrogen fluoride (HF) gas used in a process of removing a material (for example, phosphosilicate glass (PSG)) filled in the air cavity in the formation process of the air cavity under the bottom electrode 210, there is a need to protect the temperature compensation layer 300 to prevent the temperature compensation layer 300 from being removed when the filled material in the air cavity is removed.

In this case, accordingly, top of the temperature compensation layer 300 is covered with another material, so that the temperature compensation layer 300 can be protected from the HF gas in the process of removing the filled material like PSG in the air cavity.

For example, as shown in FIG. 2, the piezoelectric material 220 is formed to cover top of the temperature compensation layer 300, so that the temperature compensation layer 300 can be protected from the HF gas.

In addition to the piezoelectric material 220 for protecting the temperature compensation layer 300, materials such as silicon nitride (SiN), molybdenum (Mo), tungsten (W), gold (Au), aluminum (Al), copper (Cu), and alloy thereof can be freely used according to the kind of material used as the temperature compensation layer 300 or the kind of gas used to remove the filled material in the air cavity.

Figure 3:
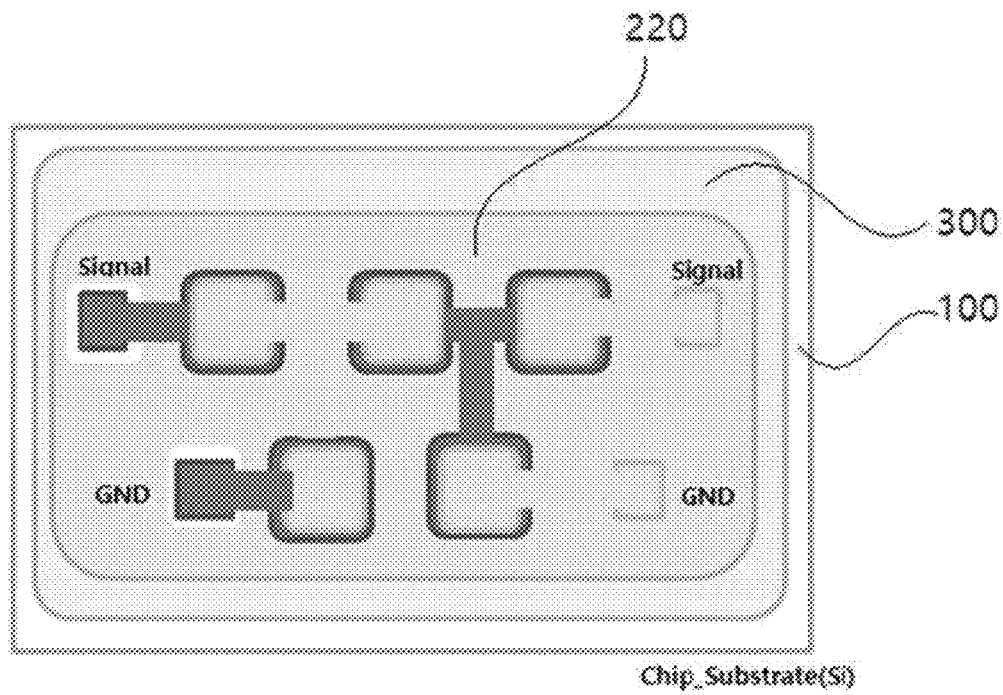
FIG. 3 is a top view showing a second example of the temperature compensation layer in the FBAR chip and package structure according to the present invention.

FIG. 3 is a top view showing a second example of the temperature compensation layer in the FBAR chip and package structure according to the present invention.

Unlike the case where the boundary line between the temperature compensation layer 300 and the piezoelectric materials 220 is irregularly formed as shown in FIG. 1, the temperature compensation layer 300 is formed along a shape of the package, as shown in FIG. 3, without any concave/convex shape along the central area where the FBARs 200 are located on the substrate 100.

As shown, the temperature compensation layer 300 has a general rectangular shape similar to the shape of the package in such a manner as to be rounded on corners thereof. That is, the boundary line between the temperature compensation layer 300 and the piezoelectric materials 220 includes linear lines with no curves or arched lines.

Also, the edges of the temperature compensation layer 300 have given gaps from the edges of the package.

If the temperature compensation layer 300 is formed as shown in FIG. 3, the process of forming the temperature compensation layer 300 is more easily carried out when compared with the process of forming the temperature compensation layer 300 having the irregularly formed boundary line with the piezoelectric materials 220 as shown in FIG. 1, and as the piezoelectric material 220 is formed with a relatively large area, further, heat dissipation performance can be improved.

Figure 4:
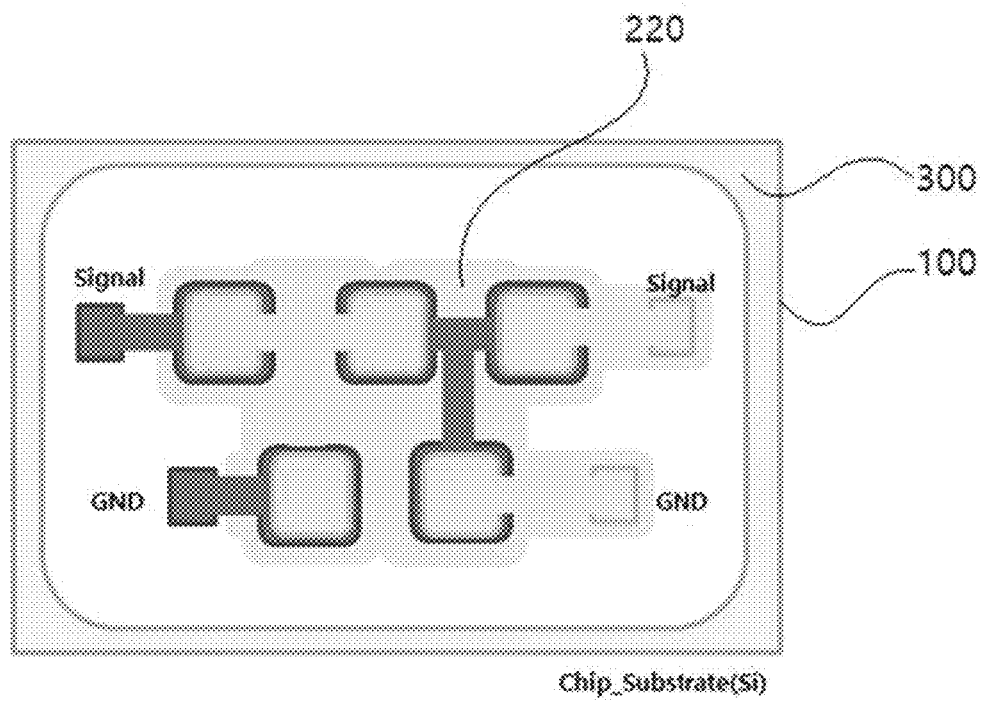
FIG. 4 is a top view showing a third example of the temperature compensation layer in the FBAR chip and package structure according to the present invention.

FIG. 4 is a top view showing a third example of the temperature compensation layer in the FBAR chip and package structure according to the present invention.

As shown in FIG. 4, the temperature compensation layer 300 is formed only on the edges of the substrate 100 on the outsides of the piezoelectric materials 220, while being spaced apart from the piezoelectric materials 220 located on the central area of the substrate 100 by a given distance.

As shown, the piezoelectric materials 220 are formed only on the positions of the FBARs 200, and accordingly, the outside boundary lines of the piezoelectric materials 220 are irregularly formed along the arrangements of the FBARs 200.

The temperature compensation layer 300 as shown in FIG. 4 is formed by cutting a dicing line in a dicing process after the temperature compensation layer 300 has been formed large on the substrate (Si wafer) before dicing of the package (or substrate).

Even in the case where the temperature compensation layer 300 is formed as shown in FIG. 4, of course, advantages in process can be much more obtained than those as shown in FIG. 1 because the dicing process is performed under the large formation of the temperature compensation layer 300 and the temperature compensation layer 300 has a simple boundary line.

Figures 5, 6:
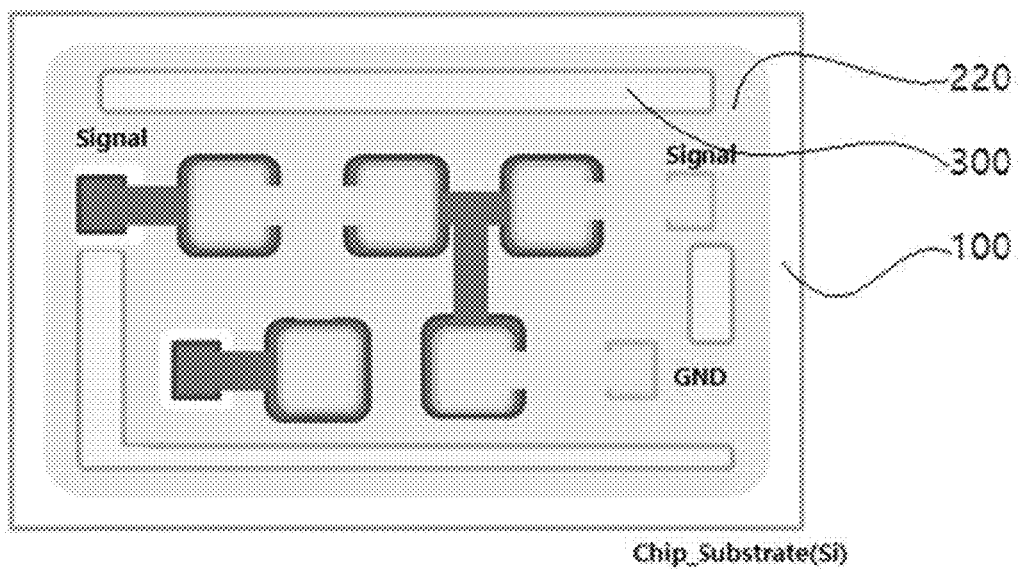
FIG. 5 is a top view showing a fourth example of the temperature compensation layer in the FBAR chip and package structure according to the present invention.
FIG. 6 is a table showing linear expansion coefficients of various materials.
Figure 7:
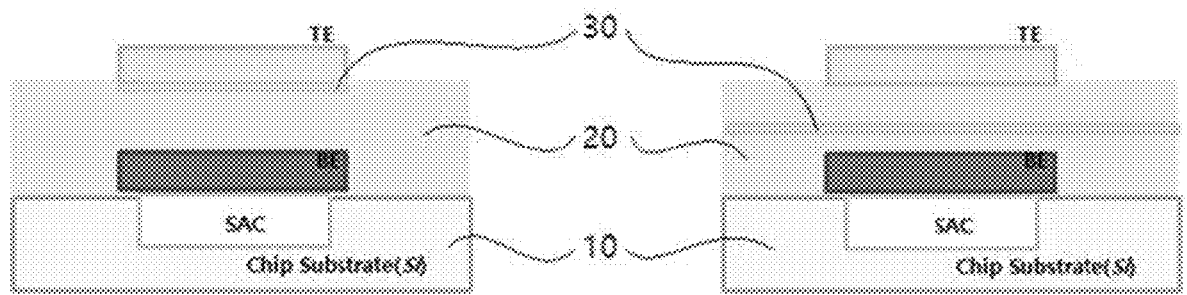
FIG. 7 is sectional views showing conventional structures for improving temperature coefficients of BAW devices.

FIG. 5 is a top view showing a fourth example of the temperature compensation layer in the FBAR chip and package structure according to the present invention.

Unlike the above-mentioned structures where the temperature compensation layers 300 surround the piezoelectric materials 220 on the outsides of the piezoelectric materials 200, the temperature compensation layer 300 as shown in FIG. 5 is formed within the piezoelectric materials 220.

Some areas of the piezoelectric materials 220 are partially etched to allow the temperature compensation layer 300 having a given shape as shown in FIG. 5 to be formed in the etched areas, so that the outermost edges of the piezoelectric materials 220 are extended up to the outside over the temperature compensation layer 300, while the temperature compensation layer 300 is being cut in some sections thereof.

The temperature compensation layer 300 as shown in FIG. 5 can be applied to the FBAR filter in which the temperature compensation layer 300 cannot be formed sufficiently according to the chip miniaturization and the piezoelectric materials 220 have to be formed large to easily perform heat dissipation according to the application of high power, and in this case, the shape of the temperature compensation layer 300 is simple to thus provide advantages in process.

Further, the temperature compensation layer 300 is formed so as to allow a width on an edge side where a larger number of the FBARs 200 are arranged than other edge sides to be larger than widths of other edge sides.

A larger amount of heat is generated from an area in which a larger number of FBARs are located than other areas in the package, and accordingly, the temperature compensation layer 300 with the relatively larger width on the area can suppress the influences caused by the change in temperature around the area.

According to the present invention, on the other hand, the temperature compensation layer 300 is made of silicon dioxide ($SiO_2$) or silicon nitride ($Si_3N_4$) having a low linear expansion coefficient.

FIG. 6 is a table showing linear expansion coefficients of various materials.

As appreciated from FIG. 6, the linear expansion coefficient of $SiO_2$ or $Si_3N_4$ used as the temperature compensation layer 300 is remarkably lower than those of other materials.

Like this, the temperature compensation layer 300 made of the material having the low linear expansion coefficient is formed on the outside of the area on which the FBARs are located on the package, so that the temperature coefficient of the package can be improved, while the characteristics of the Q factor or K2e(K2_effective) are not being deteriorated.

As mentioned above, the FBAR chip and package structure according to the present invention is capable of being more stable with respect to the change in surrounding temperature and providing an improved temperature coefficient, without any decrease in performance of Q factor or k2e.

The preferred embodiments of the present invention have been disclosed in the specification and drawings. In the description of the present invention, special terms are used not to limit the present invention and the scope of the present invention as defined in claims, but just to explain the present invention.

Thus, although the invention has been described with respect to specific embodiments, it will be appreciated that the invention is intended to cover all modifications and equivalents within the scope of the following claims.

What is claimed is:

1. A film bulk acoustic resonator (FBAR) chip and package structure with an improved temperature coefficient, comprising:
    a plurality of FBARs located on a central area of one surface of a substrate and each having a bottom electrode, a piezoelectric material, and a top electrode; and
    a temperature compensation layer formed outside each of the plurality of FBARs around the central area of one surface of the substrate,
    wherein the temperature compensation layer is formed on the substrate to completely surround the central area of one surface of the substrate,
    wherein the temperature compensation layer comes into contact with the piezoelectric materials of the FBARs in such a manner as to be formed on the outsides of the piezoelectric materials,
    wherein when viewed on top of the substrate, the boundary line between the temperature compensation layer and the piezoelectric materials is irregularly formed with a concave/convex shape along the FBARs arranged on the substrate.

2. The FBAR chip and package structure according to claim 1, wherein the temperature compensation layer is formed on at least some areas of both sides of at least one of the outermost FBARs.

3. The FBAR chip and package structure according to claim 1, wherein the temperature compensation layer is formed on at least some areas of both sides of at least one connected directly to a signal input or output pad or ground pad among the FBARs.

4. A film bulk acoustic resonator (FBAR) chip and package structure with an improved temperature coefficient, comprising:
    a plurality of FBARs located on a central area of one surface of a substrate and each having a bottom electrode, a piezoelectric material, and a top electrode; and
    a temperature compensation layer formed outside each of the plurality of FBARs around the central area of one surface of the substrate,
    wherein the temperature compensation layer is formed on the substrate to completely surround the central area of one surface of the substrate,
    wherein the temperature compensation layer comes into contact with the piezoelectric materials of the FBARs in such a manner as to be formed on the outsides of the piezoelectric materials,
    wherein when viewed on top of the substrate, the boundary line between the temperature compensation layer and the piezoelectric materials is formed linearly or archedly, with no concave/convex shape.

5. The FBAR chip and package structure according to claim 4, wherein when viewed on top of the substrate, the temperature compensation layer is formed to allow a width on an edge side where a larger number of the FBARs are arranged than other edge sides to be larger than widths of other edge sides.

6. A film bulk acoustic resonator (FBAR) chip and package structure with an improved temperature coefficient, comprising:
    a plurality of FBARs located on a central area of one surface of a substrate and each having a bottom electrode, a piezoelectric material, and a top electrode; and
    a temperature compensation layer formed outside each of the plurality of FBARs around the central area of one surface of the substrate,
    wherein the temperature compensation layer is formed on the substrate to completely surround the central area of one surface of the substrate,
    wherein the temperature compensation layer is spaced apart from the piezoelectric materials in such a manner as to be formed on the outsides of the piezoelectric materials,
    wherein when viewed on top of the substrate, the outside boundary lines of the piezoelectric materials are irregularly formed with concave/convex shapes according to the arrangements of the FBARs.

7. The FBAR chip and package structure according to claim 1, wherein the temperature compensation layer is formed in such a manner as to be cut in some sections thereof.

8. The FBAR chip and package structure according to claim 7, wherein the outermost edges of the piezoelectric materials are extended up to the outside over the temperature compensation layer.

9. The FBAR chip and package structure according to claim 1, wherein the temperature compensation layer is made of silicon dioxide ($SiO_2$) or silicon nitride ($Si_3N_4$).

* * * * *